US010522327B2

(12) United States Patent
Erel et al.

(10) Patent No.: US 10,522,327 B2
(45) Date of Patent: Dec. 31, 2019

(54) METHOD OF OPERATING A CHARGED PARTICLE BEAM SPECIMEN INSPECTION SYSTEM

(71) Applicant: Applied Materials Israel Ltd., Rehovot (IL)

(72) Inventors: Gilad Erel, Mazkeret Batia (IL); Michal Avinun-Kalish, Nes-Ziona (IL); Stefan Lanio, Erding (DE)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 16/044,770

(22) Filed: Jul. 25, 2018

(65) Prior Publication Data
US 2018/0330919 A1 Nov. 15, 2018

Related U.S. Application Data

(62) Division of application No. 14/446,146, filed on Jul. 29, 2014, now Pat. No. 10,056,228.

(51) Int. Cl.
H01J 37/02 (2006.01)
H01J 37/28 (2006.01)

(52) U.S. Cl.
CPC ............ H01J 37/28 (2013.01); H01J 37/026 (2013.01); *H01J 2237/0044* (2013.01); *H01J 2237/0048* (2013.01)

(58) Field of Classification Search
CPC .................. H01J 2237/0044; H01J 2237/0048
See application file for complete search history.

(56) References Cited

U.S. PATENT DOCUMENTS 5,155,368 A 10/1992 Edwards, Jr. et al.
6,232,787 B1 5/2001 Lo et al.
7,132,301 B1 11/2006 Fan
(Continued)

FOREIGN PATENT DOCUMENTS

CN 102005358 A 4/2011
JP 2000-208579 A 7/2000
(Continued)

OTHER PUBLICATIONS

Search Report for Taiwan Invention Patent Application No. 104124406, dated Nov. 28, 2018, 1 page.
(Continued)

*Primary Examiner* — Nicole M Ippolito
*Assistant Examiner* — Sean M Luck
(74) *Attorney, Agent, or Firm* — Kilpatrick Townsend & Stockton LLP

(57) ABSTRACT

A charged particle beam specimen inspection system is described. The system includes an emitter for emitting at least one charged particle beam, a specimen support table configured for supporting the specimen, an objective lens for focusing the at least one charged particle beam, a charge control electrode provided between the objective lens and the specimen support table, wherein the charge control electrode has at least one aperture opening for the at least one charged particle beam, and a flood gun configured to emit further charged particles for charging of the specimen, wherein the charge control electrode has a flood gun aperture opening.

7 Claims, 7 Drawing Sheets

(56) References Cited

U.S. PATENT DOCUMENTS

| | | |
|---|---|---|
| 2002/0130260 A1 | 9/2002 | McCord et al. |
| 2005/0035291 A1 | 2/2005 | Hill et al. |
| 2005/0269528 A1 | 12/2005 | Kruit |
| 2006/0163498 A1 | 7/2006 | Yoneda et al. |
| 2006/0255268 A1 | 11/2006 | Frosien |
| 2007/0272857 A1 | 11/2007 | Hasegawa et al. |
| 2010/0133433 A1 | 6/2010 | Tanimoto et al. |
| 2012/0235036 A1* | 9/2012 | Hatakeyama ...... G01N 23/2251 250/310 |
| 2016/0035537 A1 | 2/2016 | Erel et al. |

FOREIGN PATENT DOCUMENTS

| | | |
|---|---|---|
| JP | 2008-165990 A | 7/2008 |
| TW | 201342420 A | 10/2013 |
| WO | 2011/058950 A1 | 4/2013 |

OTHER PUBLICATIONS

U.S. Appl. No. 14/446,146 Restriction Requirement dated Oct. 21, 2016, 7 pages.
U.S. Appl. No. 14/446,146 Non-Final Office Action dated Mar. 30, 2017, 14 pages.
U.S. Appl. No. 14/446,146 Final Office Action dated Aug. 24, 2017, 14 pages.
U.S. Appl. No. 14/446,146 Notice of Allowance dated May 3, 2018, 7 pages.

* cited by examiner

METHOD OF OPERATING A CHARGED PARTICLE BEAM SPECIMEN INSPECTION SYSTEM

CROSS-REFERENCE TO RELATED APPLICATION

This application is division of Ser. No. 14/446,146, filed Jul. 29, 2014, the entire contents of which are incorporated herein by reference in its entirety for all purposes.

TECHNICAL FIELD OF THE INVENTION

Embodiments of the present invention relate to devices for imaging a specimen, e.g. a wafer, with one or more charged particle beams and including a flood gun. Embodiments of the present invention particularly relate to a charged particle beam specimen inspection system having an objective lens and a flood gun, specifically to a charged particle beam specimen inspection system, a multi-beam specimen inspection system, and a method of operating a charged particle beam specimen inspection system.

BACKGROUND OF THE INVENTION

Charged particle beam apparatuses have many functions, in a plurality of industrial fields, including, but not limited to, electron beam (wafer) inspection, critical dimensioning of semiconductor devices during manufacturing, defect review of semiconductor devices during manufacturing, exposure systems for lithography, detecting devices and testing systems. Thus, there is a high demand for structuring, testing and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Particularly for electron beam inspection (EBI) technology, throughput is of foremost interest. It is inter alia referred to, in particular, to surface inspection at low landing energies <500 eV and low secondary electron (SE) extraction fields. Normally, for high current density electron probe generation, compound objective lenses are used (superimposed magnetic and electrostatic retarding field lenses). In those lenses, the electron energy inside the column is reduced to the final landing energy. Further, for the purpose of pre-charging a wafer to a desirable surface potential, for example in order to increase detection sensitivity of voltage contrast (VC) defects in the wafer fabrication process, or to dis-charge/neutralize wafer charging effects, a flood gun can be used.

In view of the above, it is beneficial to provide an improved charged particle beam device and a method of operating thereof that overcome at least some of the problems in the art.

SUMMARY OF THE INVENTION

In light of the above, an improved charged particle beam wafer inspection system, an improved multi-beam wafer imaging system, and an improved method of operating a charged particle beam wafer imaging system according to the independent claims are provided. Further advantages, features, aspects and details are evident from the dependent claims, the description and the drawings.

According to one embodiment, a charged particle beam specimen inspection system is provided. The system includes an emitter for emitting at least one charged particle beam, a specimen support table configured for supporting the specimen, an objective lens for focusing the at least one charged particle beam, a charge control electrode provided between the objective lens and the specimen support table, wherein the charge control electrode has at least one aperture opening for the at least one charged particle beam, and a flood gun configured to emit further charged particles for charging of the specimen, wherein the charge control electrode has a flood gun aperture opening.

According to another embodiment, a multi-beam specimen inspection system is provided. The multi-beam specimen inspection system includes a charged particle beam specimen inspection system. The charged particle beam specimen inspection system includes an emitter for emitting at least one charged particle beam, a specimen support table configured for supporting the specimen, an objective lens for focusing the at least one charged particle beam, a charge control electrode provided between the objective lens and the specimen support table, wherein the charge control electrode has at least one aperture opening for the at least one charged particle beam, and a flood gun configured to emit further charged particles for charging of the specimen, wherein the charge control electrode has a flood gun aperture opening. The multi-beam specimen inspection system further includes at least one further emitter for emitting at least one further charged particle beam, wherein the charge control electrode has at least one further aperture opening for the at least one further charged particle beam.

According to yet another embodiment, a method of operating a charged particle beam specimen imaging system is provided. The method includes biasing a charge control electrode to a first potential, moving a specimen support table for positioning a first portion of a specimen below a flood gun aperture opening in the charge control electrode, pre-charging the first portion of the specimen with charged particles emitted from a flood gun, and moving the specimen support table for positioning the first portion of the specimen below a first aperture opening in the charge control electrode, wherein the first aperture opening is aligned with an optical axis of an objective lens of a scanning charged particle beam unit.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Figure 1:
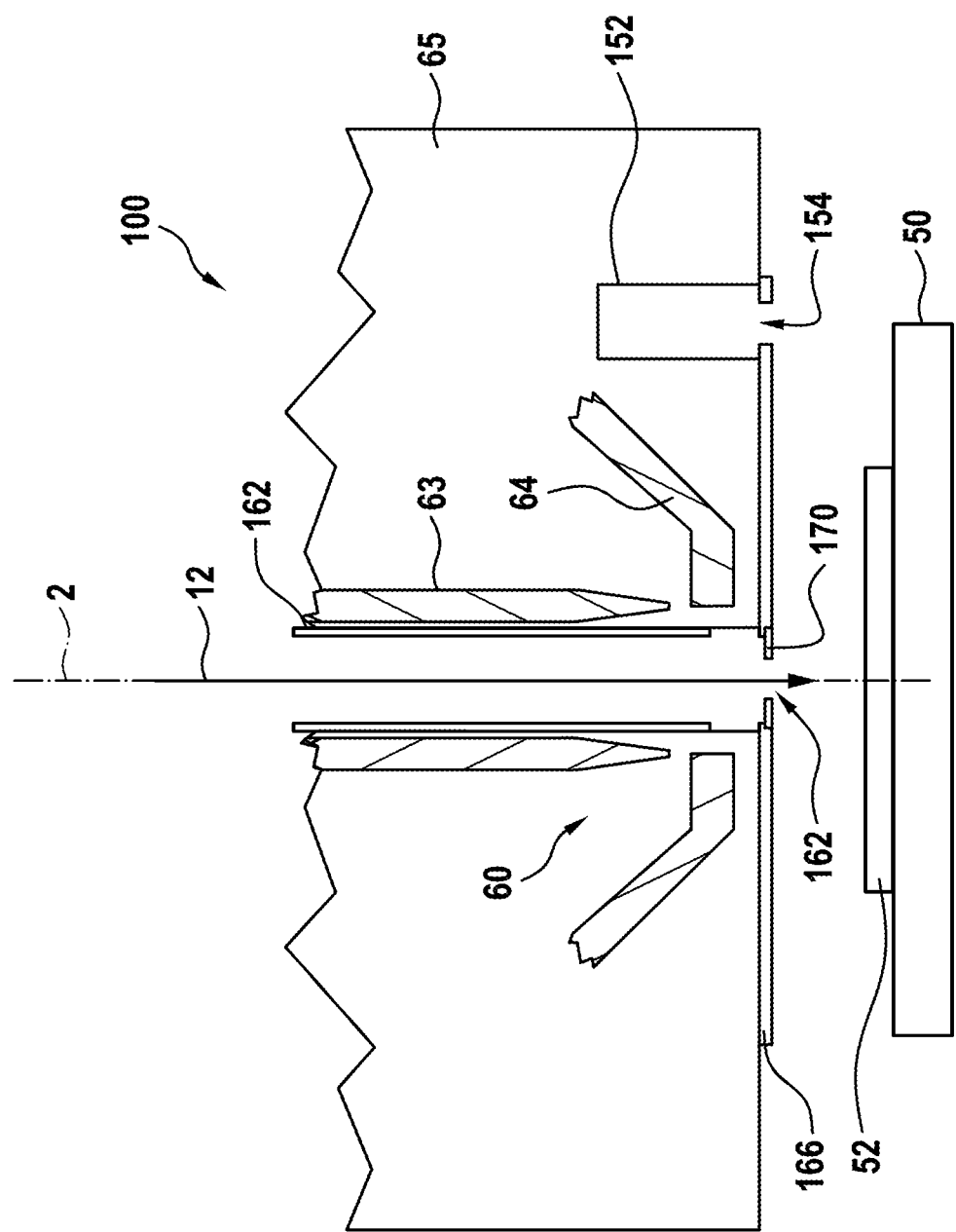
FIG. 1 illustrates a schematic partial view of a scanning charged particle beam device with a flood gun according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as an electron beam device including the detection of secondary electrons and/or backscattered electrons, which are also referred to as signal electrons. Embodiments can still be applied for apparatuses, systems and methods, in which the charged particle beam may alternatively be an ion beam. Embodiments can still be applied for apparatuses and components detecting corpuscles such as secondary and/or backscattered charged particles in the form of electrons or ions, photons, X-rays or other signals in order to obtain a specimen image. Generally, when referring to corpuscles they are to be understood as a light signal in which the corpuscles are photons as well as particles, in which the corpuscles are ions, atoms, electrons or other particles.

A "specimen" or "wafer" as referred to herein, includes, but is not limited to, semiconductor wafers, semiconductor workpieces, and other workpieces such as memory disks, masks, substrates for flat panel displays and the like. According to some embodiments, a specimen can be selected from the group consisting of: a wafer, a mask, a substrate for a flat panel display, and a flat panel display. Embodiments of the invention may be applied to any workpiece which is structured or on which material is deposited. A specimen or wafer includes a surface to be imaged and/or structured or on which layers are deposited, an edge, and typically a bevel.

According to some embodiments, which can be combined with other embodiments described herein, the apparatus and methods are configured for or are applied for electron beam inspection (EBI), critical dimension measurement and defect review applications, where the microscopes and methods according to embodiments described herein, can be beneficially used in light of high throughput of these applications.

According to some embodiments described herein, an E-beam inspection (EBI), critical dimension measurement (CD) tool, and/or defect review (DR) tool can be provided, wherein high resolution, large field of view, and high scanning speed can be achieved. According to embodiments described herein, a wafer imaging system or a wafer SEM inspection tool refers to EBI tools, CD tools or DR tools, which are specific tools as understood by a person skilled in the art.

In the context of the here described embodiments, without limiting the scope of protection thereto, an intermediate beam acceleration system intends to describe a charged particle beam apparatus with initial high acceleration of the charged particles which will be decelerated to a landing energy shortly before striking the specimen or wafer. The energy or velocity ratio $v_{acc}/v_{landing}$ between the acceleration velocity $v_{acc}$ at which the charged particles are guided through the column and the landing velocity $v_{landing}$ at which the charged particles strike the specimen can be about at least 10 or higher, e.g. 20 or higher. Furthermore, the landing energy can be 2 keV or less, e.g. 1 keV or less, such as 500 eV or even 100 eV.

Embodiments described herein relate to systems being a single or multi column scanning electron microscope having a flood gun. The flood gun is provided such that the objective lens and the flood gun shares a charge control electrode and/or the flood gun is provided to be at least partially within the objective lens housing. The scanning electron microscope and the flood gun are combined together in one wafer inspection apparatus. According to some embodiments, which can be combined with other embodiments described herein, the objective lens and the flood gun share at least some electrostatic components and/or are provided in a common magnetic environment. Accordingly, the throughput of a wafer inspection system can be further improved.

According to some embodiments, the flood gun is configured to generate a high emission current with a large spot size. The high emission current and the large spot size enable scanning and charging of large surfaces to a desired potential in a short time. According to some embodiments, which can be combined with other embodiments described herein, the emission current of the flood gun can be up to 5 mA, for example, 50 µA to 500 µA, such as 100 µA to 300 µA. According to yet further additional or alternative embodiments, the spot size in the plane of the specimen, e.g. a wafer, can be 7 mm or below, for example 3 mm to 6 mm, such as about 5 mm. The beam energy of the flood gun can, according to some examples, be 300 to 3000 eV.

Combining a flood gun in a scanning electron beam inspection system according to embodiments described herein can be beneficial in light of one or more of the following aspects. (1) The flood gun and the scanning electron beam inspection system can share one or more of the optical elements, for example the charge control electrode above the wafer. Accordingly, further power supplies and respective controllers may be shared. This can inter alia reduce the costs of ownership and/or the system complexity. (2) The provision, additionally or alternatively, of a common magnetic environment by an objective lens housing can shield magnetic fields of nearby components, for example nearby SEM columns. (3) The common charge control electrode allows for charging the specimen or wafer surface utilizing the flood gun with the same charging conditions as compared to the charging conditions of a column of the electron beam inspection system. (4) The need for an alignment between the charging system and the scanning system can be reduced. (5) The stage movement between the charging system and the scanning system can be reduced. Accordingly, the time for stage movement and/or navigation errors can be reduced. (6) The specimen or wafer can be held at the same bias below the scanning system and the flood gun, wherein the cycle time between charging and scanning is reduced. Accordingly, it may even be possible to pre-charge one portion on a wafer while scanning or inspecting another portion of the wafer. The above aspects allow for increased throughput and/or reduced cost of ownership.

According to embodiments described herein, the objective lens for an electron beam system, i.e. the last lens before the electron beam impinges on the specimen or wafer, includes a magnetic-electrostatic lens. As shown in FIG. 1, the electrostatic lens component includes an upper electrode 162, which lies on a high potential and a lower electrode, e.g. charge control electrode 166, which lies on a potential close to the sample voltage and which decelerates the electrons for providing the desired landing energy. These electrodes contribute to focusing the beam as well as to slowing the beam down to the desired low primary beam voltage.

FIG. 1 shows a portion of a scanning electron microscope 100. The objective lens includes the magnetic lens assembly 60 having an upper pole piece 63, a lower pole piece 64 and a coil (not shown in FIG. 1). The objective lens further includes an electrostatic lens component having a first electrode 162, i.e. upper electrode in the figures, and a charge control electrode 166, i.e. lower electrode in the figures. Further, a control electrode 170 for control of the signal electrons or the extraction field acting on the signal electrons respectively is provided at a position along the optical axis 2 from the position of the charge control electrode 166 to the specimen support table 50 or the specimen 52 respectively. In FIG. 1, the control electrode 170 is provided within the charge control electrode 166. The control electrode 170 can, for example, have essentially the same position along the optical axis as the charge control electrode 166. The charge control electrode 166 can also be referred to as big proxi or large proxi and the control electrode 170 can also be referred to as small proxi. According to some embodiments, the small proxi can be at the same distance from the specimen as the large proxi. According to other embodiments, the small proxi is closer to the specimen as the large proxi.

According to the embodiments described herein, it is understood that the small proxi, i.e. the control electrode 170, has a small influence on the properties of the electrostatic lens component, yet is sufficiently small enough to be considered an individual element, with the functionality to control the extraction of the SEs from the specimen or the guidance of SEs released from the specimen.

The objective lens 60 focuses the electron beam 12, which travels in the column along optical axis 2, on the specimen 52, i.e. in a specimen plane. The specimen 52 is supported on a specimen support table 50. According to some embodiments, which can be combined with other embodiments described herein, scanning of an area of the specimen can be conducted by movement of the table in a first direction essentially perpendicular to the optical axis and by scanning lines in another, second direction essentially perpendicular to the optical axis and essentially perpendicular to the first direction.

A flood gun 152 is provided in the scanning electron microscope 100. As shown in FIG. 1, the flood gun 152 shares the charge control electrode 166 with the scanning inspection system of the scanning electron microscope. According to embodiments described herein, the charge control electrode 166 has at least one aperture opening 162 and a flood gun aperture opening 154. The specimen support table can be moved to a first position, in which the electron beam 12 impinges on the specimen 52, for example a position as shown in FIG. 1. The specimen support table 50 can further be moved to a second position, in which charged particles emitted from the flood gun impinge on the specimen 52, for example a wafer.

According to yet further embodiments, which can be combined with other embodiments described herein, a charged particle beam wafer inspection system, such as the scanning electron microscope 100 shown in FIG. 1, includes an objective lens housing 65. The objective lens housing 65 surrounds the objective lens, and particularly the upper pole piece 63 and the lower pole piece 64. For example, the objective lens housing 65 is magnetically insulated from the pole pieces by an air gap or a magnetic insulator, i.e. a material with a relative permeability $\mu/\mu_0=1$, such as copper or the like. According to some embodiments, which can be combined with other embodiments described herein, the objective lens housing 65 can include a material having a relative permeability $\mu/\mu_0$ of 10000 or above, for example mu-metal or the like. The flood gun 152 and the objective lens 60 share the same magnetic environment by having the objective lens housing 65 surrounding at least a portion of the flood gun 152. The objective lens housing can shield the fields of nearby SEM columns or other devices for the objective lens 60 and the flood gun 152.

According to some embodiments described herein, the objective lens, can be electrostatic, magnetic or combined magnetic-electrostatic. A magnetic lens or a magnetic lens assembly can be provided by a permanent magnet, a coil, or a combination thereof. For example a the objective lens can have a magnetic lens assembly including one or more pole pieces. According to embodiments described herein, an objective lens having surrounds the objective lens and shields one or both of magnetic fields and electrostatic fields. The objective lens housing surrounds at least a portion of the flood gun. Accordingly, the flood gun can be placed close to the objective lens.

Sharing at least one of the charge control electrode 162 and the objective lens housing 65 allows for reduced costs and a small footprint of the inspection system. Further, the flood gun 152 can be provided at a distance from the scanning electron beam components such that the specimen support table 50 can move the specimen 52 from the electron beam to a position below the flood gun 152 and vice versa in a reduced time.

Figure 2:
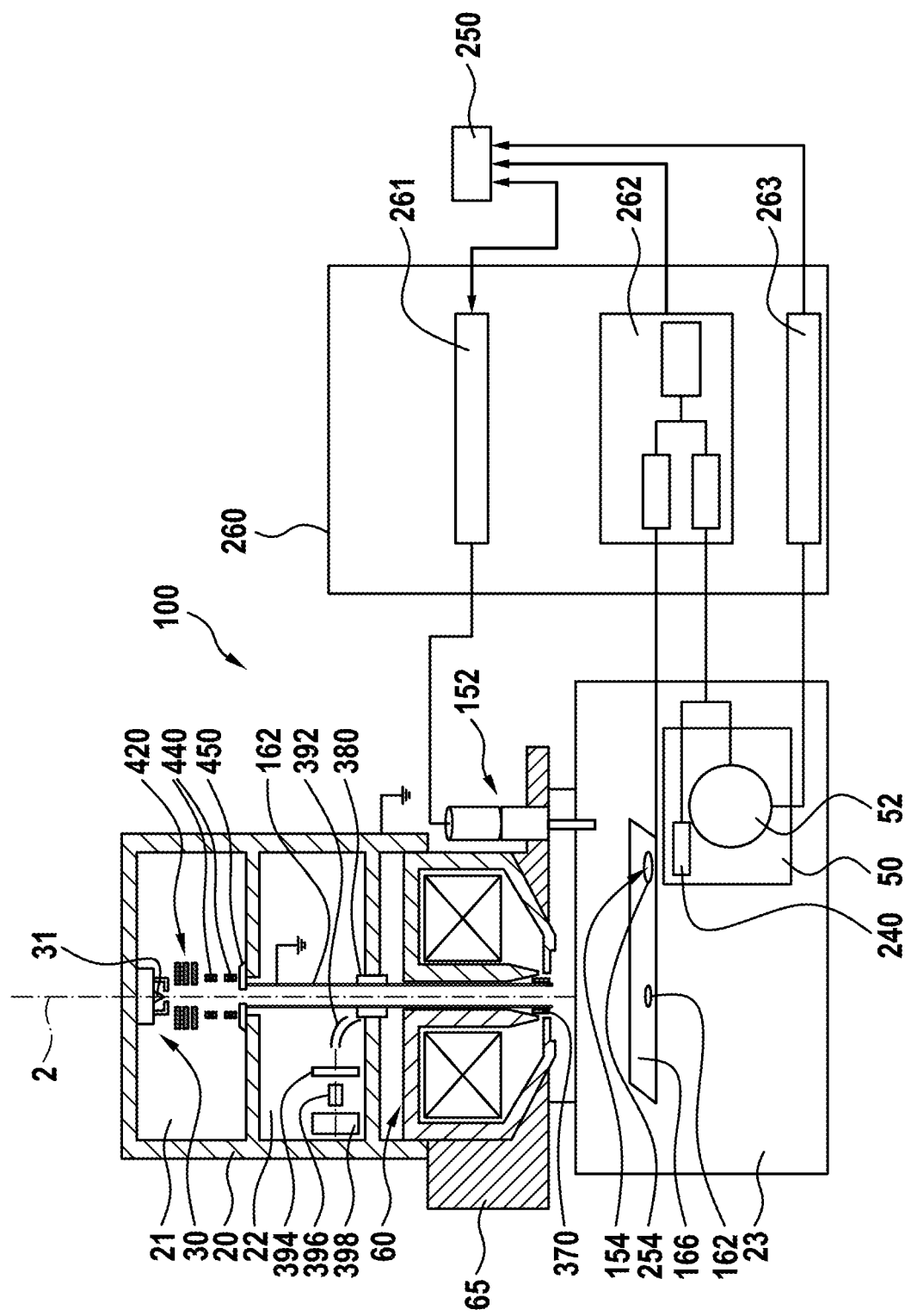
FIG. 2 illustrates a schematic view of a scanning charged particle beam device with a flood gun according to embodiments described herein.

Further embodiments can be described with respect to FIG. 2. FIG. 2 shows a charged particle beam device, such as an SEM imaging apparatus, i.e. scanning electron microscope 100 having a flood gun 152. The electron beam column 20 provides a first chamber 21, a second chamber 22 and a third chamber 23. The first chamber, which can also be referred to as a gun chamber, includes the electron source 30 having an emitter 31 and suppressor.

According to embodiments described herein, the emitter 31 is connected to a power supply for providing a voltage to the emitter. The emitter can be an emitter of one or more emitters of an emitter assembly. For the examples described herein, the potential provided to the emitter is such that the electron beam is accelerated to an energy of 8 keV or above. Accordingly, typically the emitter is biased to a potential of −8 keV or higher negative voltages, e.g. in the case where the column and the beam guiding tube, which also provides the first electrode 162 in FIG. 2, are on ground potential. However, higher beam energies inside the column, e.g. 20 keV or higher, will be even more advantageous for the electron optical performance (e.g. resolution or current density). As described above, having the emitter on a positive potential is a typical embodiment with the benefits that the column and the beam guiding tube can be at ground or at a moderate potential. Yet, with respect to the focusing properties of the zoom lens according to embodiments described herein, the emitter could also be grounded and a power supply could be connected to the electrode 162 shown in FIG. 2.

An electron beam is generated by the electron beam source 30. The beam is aligned to the beam-shaping aperture 450, which is dimensioned to shape the beam, i.e. blocks a portion of the beam. Thereafter, the beam passes through the beam separator 380, which separates the primary electron beam and the signal electron beam, i.e. the signal electrons. The primary electron beam is focused on the specimen 52 or wafer by the objective lens. The specimen is positioned on the specimen stage, i.e. a specimen support table 50. On impingement of the electron beam, for example, secondary or backscattered electrons are released from the specimen 52, which can be detected by the detector 398. Even though backscattered electrons and secondary electrons are typically detected by the detector, some passages of this disclosure relate to secondary electrons only, i.e. as a comparison to primary electrons, and it is understood that backscattered electrons are also considered to be signal electrons or similar to secondary electrons as understood herein, i.e. there are secondary products for signal generation of the image.

According to some embodiments, which can be combined with other embodiments described herein, a condenser lens 420 and a beam shaping or beam-limiting aperture 450 is provided. The two-stage deflection system 440 is provided between the condenser lens and the beam-shaping aperture 450 for alignment of the beam to the beam shaping aperture. According to embodiments described herein, which can be combined with other embodiments described herein, the electrons are accelerated to the voltage in the column by an extractor or by the anode. For example, the extractor can be provided by the first (upper) electrode of the condenser lens 420 or by a further electrode (not shown). According to yet further embodiments, the condenser lens may also be a magnetic condenser lens for controlling the probe diameter.

Further, a scanning deflector assembly 370 is provided. For example, the scanning deflector assembly 370 can be a magnetic, but preferably an electrostatic scanning deflector assembly, which is configured for high pixel rates. According to typical embodiments, which can be combined with other embodiments described herein, the scanning deflector assembly 370 can be a single stage assembly as shown in FIG. 2. Alternatively, also a two-stage or even a three-stage deflector assembly can be provided. Each stage of the deflector assembly can be provided at a different position along the optical axis 2.

Signal electrons, e.g. secondary and/or backscattered electrons, are extracted from the wafer or specimen e.g. by a control electrode and are further accelerated within the objective lens. The beam separator 380 separates the primary electrons and the signal electrons. The beam separator can be a Wien filter and/or can be at least one magnetic deflector, such that the signal electrons are deflected away from the optical axis 2. The signal electrons are then guided by a beam bender 392, e.g. a hemispherical beam bender, and a lens 394 to the detector 398. Further elements like a filter 396 can be provided. According to yet further modifications, the detector can be a segmented detector configured for detecting signal electrons depending on the starting angle at the specimen.

An objective lens housing 65 surrounds the objective lens 60. Further, at least a portion of the flood gun 152 can be surrounded by the objective lens housing 65. According to some embodiments, the objective lens and the flood gun can have a common objective lens housing. The charge control electrode 166 is provided between the wafer or specimen 52 (or the wafer support table 50, respectively) and the common objective lens housing 65. This allows for controlling the charging potential of the specimen surface, e.g. the wafer surface, under the flood gun and the scanning electron microscope column. The voltage difference between the wafer and the charge control electrode determines the resultant wafer potential. Flood gun electrons, i.e. the charged particles emitted from the flood gun, pass the charge control electrode 166 through the flood gun aperture opening 154. According to some embodiments, which can be combined with other embodiments described herein, the flood gun aperture opening can be covered with a mesh 254 or grid. The mesh or grid can improve the uniformity of the electrostatic field above the specimen. Accordingly, the uniformity of the charging profile can be improved with the mesh 254, e.g. a grid.

FIG. 2 shows a power supply 261 for the flood gun 152. The power supply 261 is provided in an electrical cabinet 260. Further, a power supply 262 is provided, wherein the charge control electrode 166 and the wafer or the specimens support table 50, respectively, can be biased to the desired potentials. Further, the controller 263 for controlling the movement of the specimen support table 50 can be provided. According to embodiments described herein, power supplies and individual controllers can be controlled by a main controller 250, such as a main computer having at least a CPU and a memory.

According to yet further embodiments, which can be combined with other embodiments described herein, a calibration target 240 can be provided on the specimen support table 50. Details of the calibration target 240 are described with respect to FIGS. 5A and 5B. The calibration target 240 is connected with the power supply 262 for biasing the specimen 52 or the specimen support table 50, respectively.

The calibration target is configured for characterizing the beam of electrons emitted from the flood gun 152 and/or for measuring the current emitted from the flood. The emission current of the flood gun can be up to 5 mA, for example, 50 μA to 500 μA, such as 100 μA to 300 μA. The high emission current of the flood gun allows for a better throughput of the inspection system since pre-charging and/or dis-charging can be conducted in a much shorter time. According to yet further additional or alternative embodiments, the spot size in the plane of the specimen or wafer can be 7 mm or below, for example 3 mm to 6 mm, such as about 5 mm. Accordingly, the current density is lower when using a flood gun, for example in the range of 1 to 10 μA/mm$^2$. This reduces the likelihood of having artifacts when inspecting a specimen, for example a wafer. Yet, the higher emission current allows for charging some types of layers to the desired potential, which could not be charged with the electron beam of the scanning electron beam column. Particularly, layers having a large capacitance may not be charged to the desired potential with an electron beam of a scanning electron microscope.

Embodiments described herein can be utilized for or can include pre-charging a wafer to a desirable surface potential, for example in order to increase detection sensitivity of voltage contrast (VC) defects in the wafer fabrication process, and scanning an electron beam of a scanning electron beam microscope over the pre-charged surface thereafter. According to some embodiments, the uniformity of pre-charging over a scanned area can be 10 V peak-to-peak or below. For example, the specimen, such as a wafer, can be charged to 100 V±5V.

As shown in FIG. 2, the flood gun 152 uses some common interface with the SEM column. The charge control electrode 166, which is configured to be used during pre-charging, i.e. operation of the flood gun, and which is configured to be used during inspection with a scanning electron beam, is provided in the chamber 23. That is, the flood gun and the SEM column are operated under the same vacuum condition, i.e. they share the same pressure within the vacuum chamber.

The specimen support table 50 includes an X-Y-stage navigation system, which is configured to move the specimen, for example a wafer, under the SEM column and/or the flood gun. The wafer is biased to a voltage potential, which determines the landing energy of the electrons on the wafer.

Figure 3A:
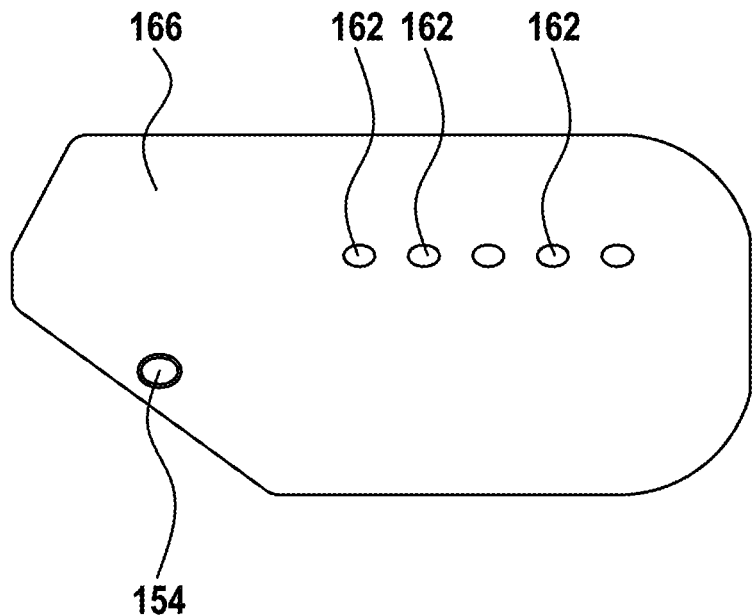
FIG. 3A illustrates a schematic view of a charge control electrode for a charged particle beam wafer inspection system according to embodiments described herein.

FIG. 3 shows a charge control electrode 166. The charge control electrode 166 has an opening 154. Charged particles, for example electrons, which are emitted from the flood gun can pass through the opening 154 of the charge control electrode 166. The charge control electrode further includes openings 162. The example shown in FIG. 3A shows five openings 162 for five electron beams of a scanning electron beam system. The charge control electrode is also provided in the chamber 23, i.e. the vacuum chamber, as shown in FIG. 2, and is common for the SEM column and the flood gun. Accordingly, the charge control of the flood gun and the SEM column is controlled by the same high voltage controller.

A conductive mesh 254 is provided at the flood aperture opening or within the flood gun aperture opening. That is, the aperture opening is covered with a thin metal mesh or a grid in order to generate a uniform and planar electrostatic field between the specimen, for example a wafer, and the charge control electrode. The conductive mesh 254 can be biased to the potential of the charge control electrode. By biasing the conductive mesh, a uniform and planar electrostatic field can be provided. This improves the uniformity of the profile of the pre-charging.

Figure 3B:
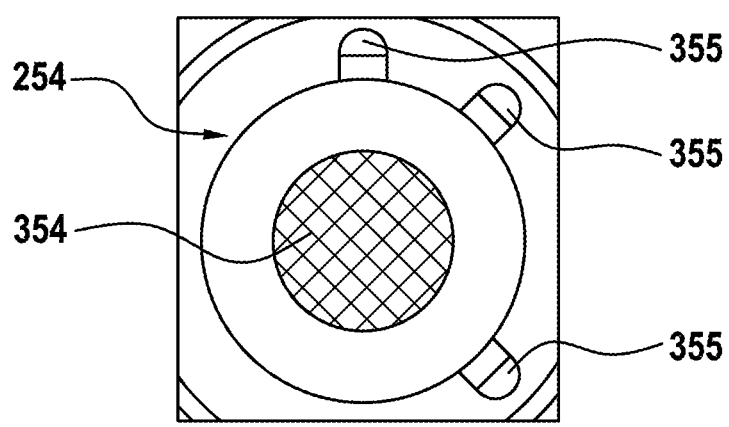
FIG. 3B illustrates a schematic view of a conductive mesh, which may be provided to close an aperture opening in a charge control electrode according to embodiments described herein.

As shown in FIG. 3B, the conductive mesh 254 includes a plurality of wires 354. A first plurality of wires 354 extend in a first direction and a second plurality of wires 354 extend in a second direction, which is different from the first direction. For example, the second direction can be essentially perpendicular to the first direction. For example, the second direction can have an angle of 80° to 100° with respect to the first direction. The first plurality of wires 354 and the second plurality of wires 354 form the mesh 254.

According to some embodiments, which can be combined with other embodiments described herein, the first direction of the first plurality of wires and the second direction of the second plurality of wires is not parallel to one of the specimen movement directions of the specimen support table 50, which may for example move in an X-direction and a Y-direction. Further, additionally or alternatively, the first direction of the first plurality of wires and the second direction of the second plurality of wires are not parallel to one of the scanning directions of the charged particles emitted from the flood gun, which can be deflected by a beam deflection system within the flood gun. The scanning directions may also correspond to the X-director and the Y-direction of the specimen support table 50. Particularly, the first direction of the first plurality of wires and the second direction of the second plurality of wires can have an angle of 30° to 60°, for example about 45°, with respect to the X-direction or the Y-direction. Providing such an angle can avoid an uncharged line on the surface of the specimen when scanning the flood gun electrode over the specimen.

The conductive mesh 254 can have one or more protrusions 355. The protrusions 355 can be used to provide a fixed orientation of the first direction of the first plurality of wires and the second direction of the second plurality of wires with respect to the specimen movement direction and/or scanning direction. The protrusions 355 may further be utilized for an electrical connection between the conductive mesh and the charge control electrode. Yet further, the protrusions may serve for easy replacement of the conductive mesh. A typical mesh may include wires having a thickness of 5 μm to 100 μm. A typical mesh may be manufactured to have spaces between the wires of 80 μm to 200 μm. The ratio between the dimension of the wires and the dimension of this basis determines a blocking ratio, which may be 10% to 30%, for example about 20%.

Figure 4:
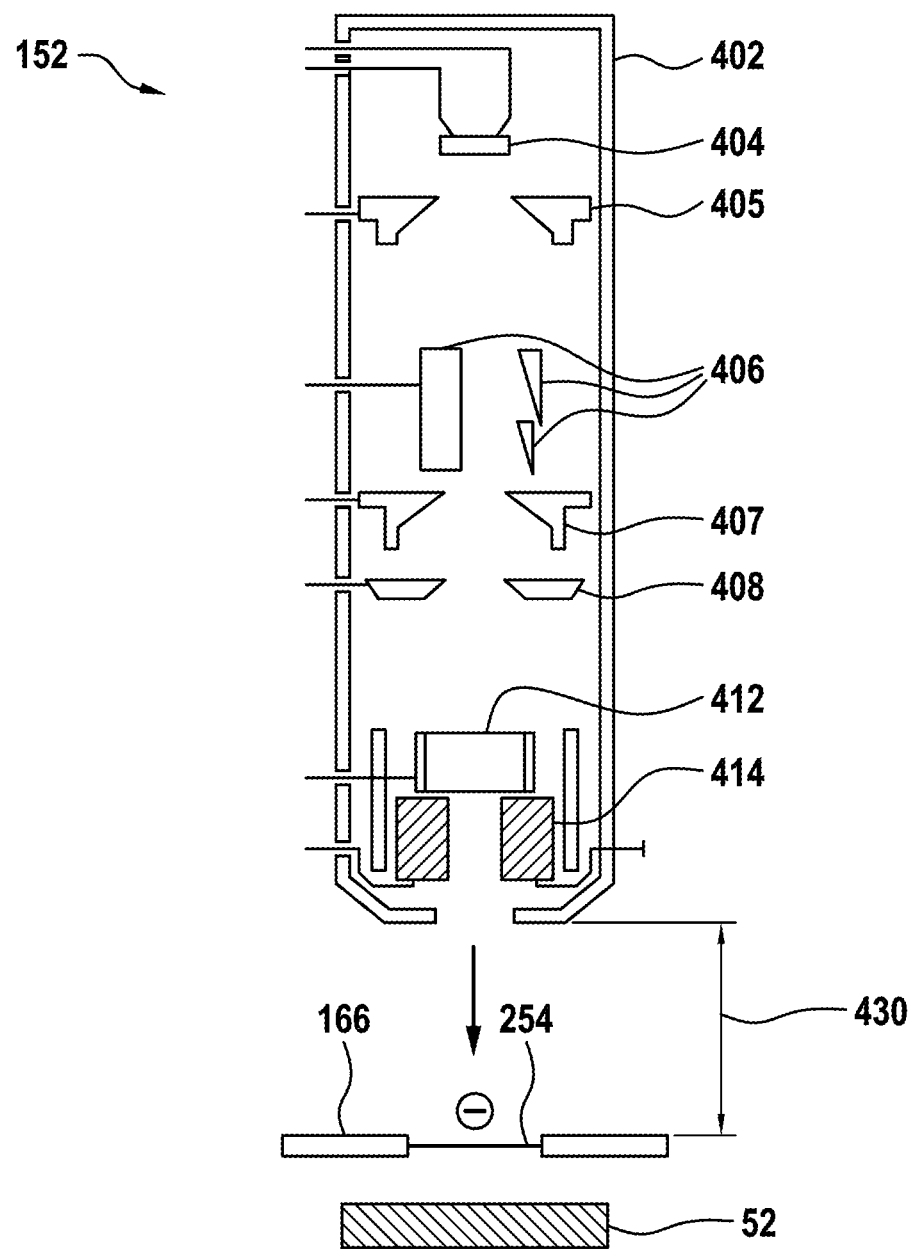
FIG. 4 shows a schematic of a flood gun, which is provided in a charged particle beam inspection system according to embodiments described herein.

FIG. 4 shows the flood gun 152. The flood gun has a housing 402. Electrons are emitted from the emitter 404 and accelerated by the anode 405. According to some embodiments, a beam blanker system 406 can be provided. The beam blanker system can deflect the beam of electrons, such that the electrons are blocked by the beam blocker 407. An electrode 408 can be provided in order to focus the beam of charged particles. Accordingly, some embodiments may include a focusing option. The first beam scanning system 412 for deflecting the beam in a first direction, for example an X-direction, and the second beam scanning system 414 for deflecting the beam in a second direction, for example a Y-direction, can be provided. The beam deflection system of the flood gun is configured to align the flood gun electrons to pass through the center of the aperture opening in the charge control electrode. The aperture-opening diameter is limiting the flood gun beam size on the wafer plane to the desired size and shape. The diameter limitation can further serve to avoid charging in undesired regions.

FIG. 4 further shows the charge control electrode 166 having an aperture opening provided therein. The aperture opening in the charge control electrode 166 is closed by the conductive mesh 254. The electrons emitted from the flood gun 152 impinge on a specimen 52, for example a wafer. According to embodiments described herein, the emission current can be controlled by controlling the source voltage. By controlling the source voltage, a constant emission current can be provided. The focusing lens provided by the electrode 408, for example provided by the potential of the electrode in combination with other electrodes and potentials within the flood gun 152, allows for controlling the spot diameter of the electrons emitted from the flood gun. Control of the spot diameter is beneficial in order to avoid flooding outside of the wafer surface during charging or the calibration target surface during calibration. Flooding outside of the desired region, for example on cables or the like may deteriorate the operation of the charged particle beam inspection system due to the high beam currents emitted by the flood gun. The control of the flooding on the desired services can further be improved by the beam blanker 406 and/or the first beam scanning system and the second beam scanning system, which may deflect the beam of electrons emitted from the flood gun.

FIG. 4 further shows the working distance 430, i.e. the distance of the lower portion of the housing 402 from the surface of the specimen. The housing 402 of the flood gun does not only provide a compartment for the components provided therein but also defines the region in which the potentials within the flood gun influence the electron beam of the flood gun. Accordingly, the working distance 430 is provided between the lower portion of the housing 402 and the surface of the specimen 52. According to some embodiments, which can be combined with other embodiments described herein, the working distance can be from 60 mm to 90 mm, for example from 70 mm to 80 mm. The combination of beneficial choice of the working distance with the conductive mesh allows for the desired uniformity of the electrostatic field between the wafer and the charge control electrode. This allows the charging profile to be within a desired range of 10 V peak-to-peak or below.

Figure 5A:
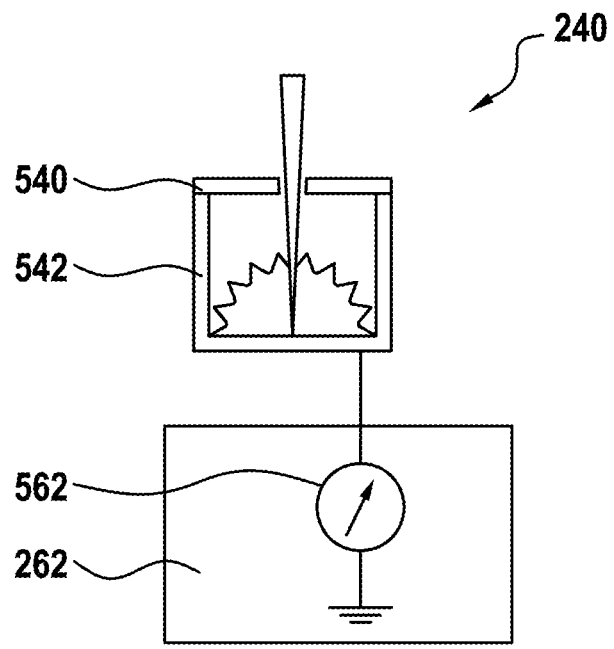
FIGS. 5A and 5B illustrate schematic views of a calibration target, which can be utilized in a charged particle beam wafer inspection system according to embodiments described herein.

FIG. 5A shows the calibration target 240. The calibration target 240 is for example positioned on the specimen support table 50 as shown in FIG. 2. The calibration target 240 can be utilized for characterizing the beam of the flood gun 152 and/or for measuring the current emitted from the flood gun 152. In order to calibrate the flood gun, the specimen support table 50 is moved such that the electrons from the flood gun impinge on the calibration target 240. Accordingly, the calibration target is located on the stage assembly. The calibration target allows for controlling the voltage potential of the specimen support table. According to embodiments described herein, the beam emitted from the flood gun can be characterized with the specimen support table, or the specimen respectively, is biased to the operating voltage.

As shown in FIG. 5A, the calibration target 240 is connected to the power supply 262 for biasing the wafer or the specimen support table, respectively. Variations in the power supply signal while scanning the flood gun spot over the calibration target can be analyzed. This analysis allows characterization of the flood gun spot with the power supply signals of the power supply 262. Contrary to the Faraday cup, which is typically grounded for measuring the current, the calibration target according to some embodiments described herein operates under a biased condition.

The calibration target 240 has an aperture plate 540 with at least one opening. The electron beam emitted from the flood gun can pass through the opening in the aperture plate 540. The electron beam impinges on a cup 542. The cup 542 includes an electron absorbing material, e.g. conductive material. A current detection device 562 in the power supply 262 provides the signal indicative of the current in the power supply. During flood gun calibration the current in the power supply 262 is zero if the electron beam of the flood gun is switched off. If the electron beam of the flood gun is switched on, the current can be detected in the power supply. According to some embodiments, which can be combined with other embodiments described herein, the calibration target 240 is biased during the flood gun calibration. For example, the calibration target is biased to the same potential as the wafer curing imaging and/or pre-charging of the wafer with the charged particle beam inspection system. Since the target is biased to the potential of the wafer and/or the specimen support table, there is a low risk of high voltage damages.

Figure 5B:
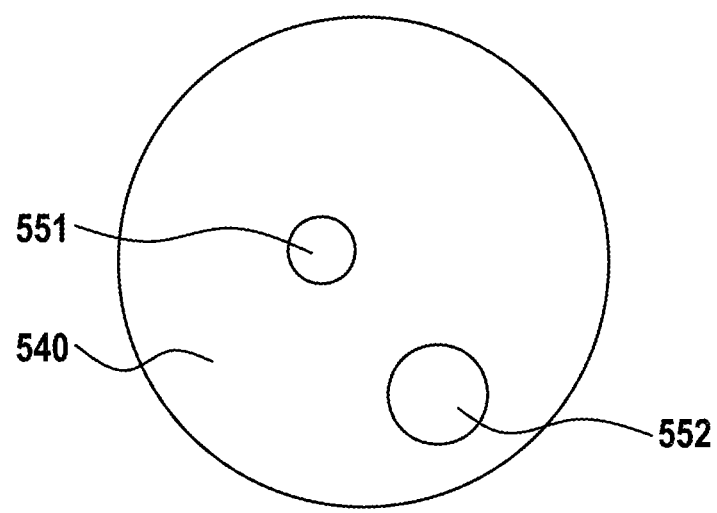

According to some embodiments, which can be combined with other embodiments described herein, the aperture plate 540 can include at least two openings. As shown in FIG. 5B the aperture plate 540 can include a small opening 551 and a large opening 552. The small opening 551 has a diameter, which is smaller than the diameter of the electron beam emitted from the flood gun. For example, the diameter of the small opening 551 can be 1 mm or below. The large opening 552 has a diameter which is larger than the diameter of the electron beam emitted from the flood gun. For example, the diameter of the large opening 552 can be 5 mm or above.

For the measurement of the total current, the calibration target 240 is positioned, for example by moving the specimen support table, such that the electron beam emitted from the flood gun passes through the large opening 552 of the aperture plate 540. The entire current is collected in the cup 542 and the resulting current is measured in the voltage supply 262. For characterizing the beam emitted from the flood gun, the calibration target 240 is positioned, for example by moving the specimen support table, such that the electron beam emitted from the flood gun partly passes through the small opening 551 of the aperture plate 540. The position of the small opening 551 can be varied by scanning the specimen support table, for example in X and Y directions. Since the small opening 551 is smaller than the beam diameter, only a portion of the electron beam emitted from the flood gun passes through the aperture plate and is collected by the cup 542. Measuring the current detected in the voltage supply 262 as a function of the position of the specimen support table, i.e. the position of the small opening 551, allows for generating a current profile of the electron beam. Accordingly, the electron beam emitted from the flood gun can be characterized. For example, the shape of the electron beam can be measured with the calibration target 240.

Figure 6:
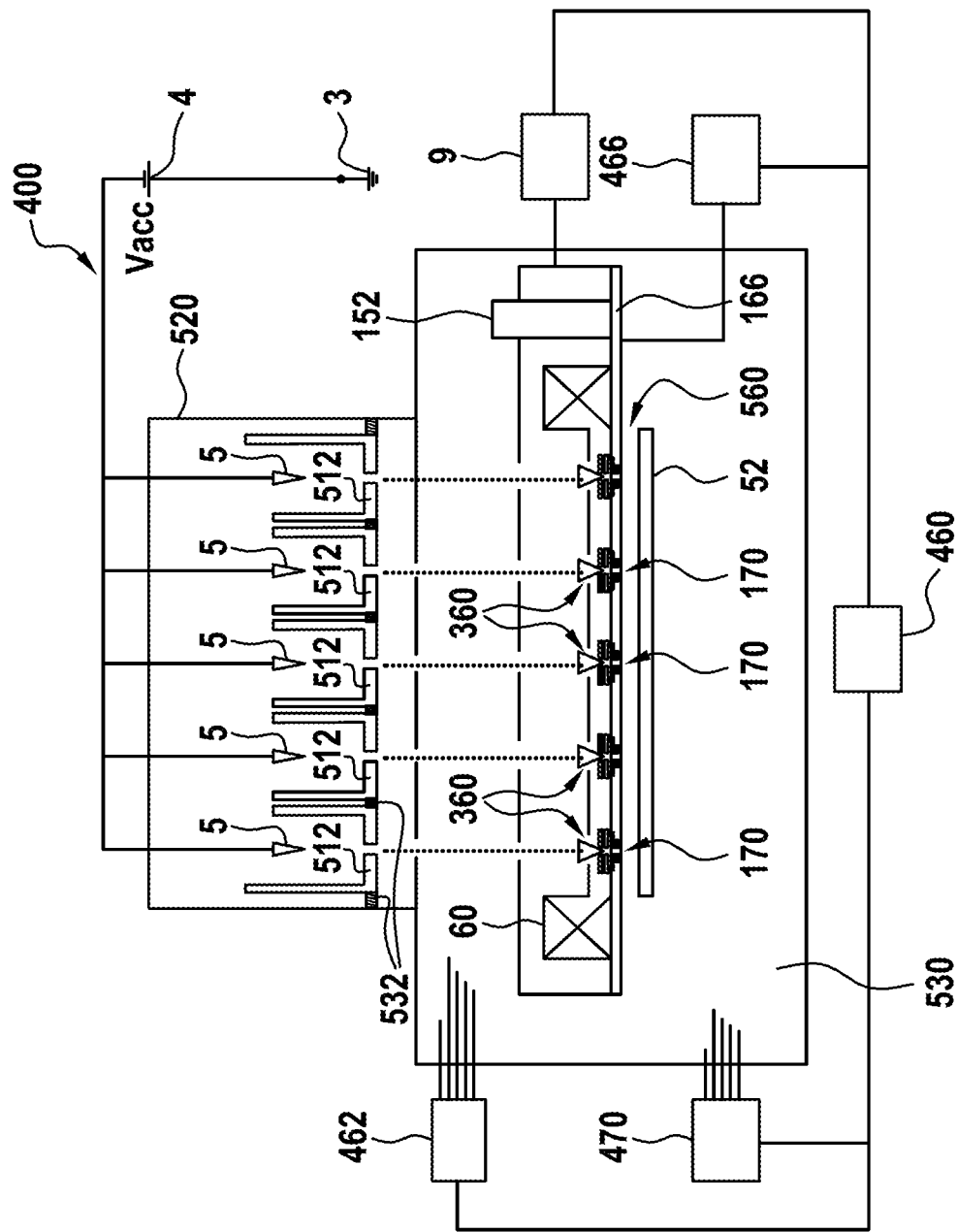
FIG. 6 shows a schematic view of a multi-beam wafer imaging system having a flood gun according to embodiments described herein.

FIG. 6 illustrates yet further embodiments, wherein a retarding field scanning microscope, i.e. wafer imaging system 400 is provided as a multi-beam device. Typically, two or more beams can be provided in a multi-beam device. As an example, FIG. 5 shows five emitters 5 such that five electron beams are emitted in the gun chamber 520. This corresponds to the five aperture openings in the charge control electrode shown in FIG. 3A. The emitter tips are biased to an acceleration potential $V_{acc}$ by voltage supply 4, which provides a potential to the tips as compared to ground 3. Electrodes 512, e.g. extractors or anodes can be provided, e.g. in a cup-like shape. These electrodes are electrically insulated by insulators 532 with respect to each other and with respect to the gun chamber 520. According to some embodiments, which can be combined with other embodiments described herein, also two or more of the electrodes selected from the group consisting of extractor and anode can be provided. Typically, these electrodes 512 are biased to potentials by voltage supplies (not shown) in order to control the two or more electron beams.

The charged particle beams travel in a further chamber 530, in which a specimen 52 is provided. The objective lens 560 focuses the beams on the specimen or in a specimen plane, respectively. The objective lens can have a magnetic lens assembly 60 with a common magnetic lens portion, i.e. a magnetic lens portion acting on two or more of the charged particle beams. For example, one common excitation coil is provided to a pole piece unit or a pole piece assembly, wherein several openings for passing of the two or more electron beams through the pole piece unit are provided. The one common excitation coil excites the pole piece unit, such that, for example, one beam is focused per opening. Power supply 9 can provide the current for the magnetic lens portion of the objective lens.

As shown in FIG. 6, the objective lens 560 further includes an electrostatic lens component 360. For example, an electrostatic lens portion 560 having one or more first electrodes and a second electrode are provided. The second electrode can be a charge control electrode with aperture openings for the scanned electron beams and an aperture opening for charged particles emitted from the flood gun.

152. As shown in FIG. 6, the first electrode can also be provided as a separated electrode for one or more of the electrostatic lens portions. That is the first electrode can be separate and/or independent of a beam guiding tube in the column. This can also apply for the single beam columns described herein. Further, for each of the electrons beams, a control electrode can be provided.

Three power supplies 462, 466 and 470 are shown in FIG. 6. Some of the power supplies have exemplarily five connection lines for respective electrodes for each of the five electrostatic lens components. For example, power supply 462 can be connected to the respective first electrodes, power supply 466 can have a single connection to the common charge control electrode, and power supply 470 can be individually connected to the respective control electrodes. The controller 460 is connected to the voltage supplies 462, 466 and 470 for the electrodes of the electrostatic lens components and the control electrodes. The various connection lines entering the column housing from some of the power supplies (the rest of which is omitted for better overview) illustrate that each of the electrodes for the individual beams can be controlled independently. However, it can be understood that one or more of the electrodes of the electrostatic lens components and one or more of the control electrodes can also be biased with a common power supply. Further, it is noted that particularly the power supply 462 can be omitted if the first electrode is grounded as explained above.

According to some embodiments, the objective lens can be provided according to any of the embodiments described herein. It has to be considered that particularly for EBI applications, but also for CD/DR applications, as compared to common wafer imaging, throughput is a critical aspect to be considered. The operational modes described herein are useful for high throughput. Also cold field emitters (CFE) and thermally assisted field emitters (TFEs) can be used to increase the throughput. Accordingly, the combination of a flood gun according to embodiments described herein with a CFE, a thermally assisted field emitter, or a Schottky emitter is particularly useful. As a further implementation, a combination with a multi-electron beam device as e.g. described with respect to FIG. 6 further provides a specific combination, which can be considered beneficial for the throughput of wafer inspection.

According to different embodiments, which can be combined with other embodiments described herein, a multi-beam wafer inspection system can include two or more beams, wherein one beam each can be provided in two or more columns, wherein two or more beams can be provided in one column, or both, i.e. two or more columns can be provided, wherein each of the two or more columns include two or more beams on the specimen, e.g. a wafer. If two or more columns are provided, they may share some components, e.g. the charge control electrode. If two or more beams are provided in one column they may be generated by a combination of a multi-opening aperture plate and a deflection system such that two or more virtual sources are generated.

The embodiments described herein, may as well include additional components (not shown) such as condenser lenses, deflectors of the electrostatic, magnetic or compound electrostatic-magnetic type, such as Wien filters, stigmators of the electrostatic, magnetic or compound electrostatic-magnetic type, further lenses of the electrostatic, magnetic or compound electrostatic-magnetic type, and/or other optical components for influencing and/or correcting the beam of primary and/or signal charged particles, such as deflectors or apertures. Indeed, for illustration purposes, some of those components are shown in the figures described herein. It is to be understood that one or more of such components can also be applied in embodiments of the invention.

Figure 7:
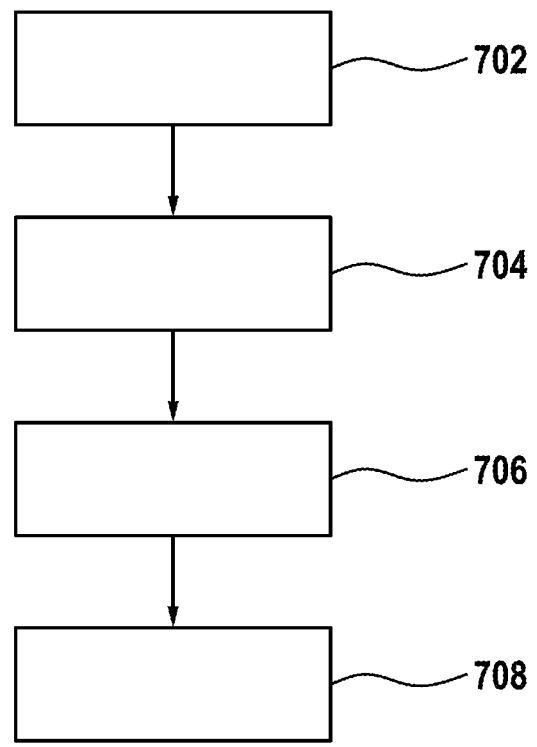
FIG. 7 shows a flow chart of a method of operating a charged particle beam inspection system, according to embodiments described herein.

According to some embodiments, a method of operating a charged particle wafer imaging system is provided. A flow chart of the method of operating a charged particle wafer imaging system is shown in FIG. 7. The method includes biasing a charge control electrode to a first potential as shown in box 702. A specimen support table is moved for positioning a first portion of a wafer below a flood gun aperture opening in the charge control electrode (see reference numeral 704). As indicated by box 706 the first portion of the wafer is pre-charged with charged particles emitted from a flood gun. After pre-charging the specimen support table is moved (see reference numeral 708) for positioning the first portion of the wafer below a first aperture opening in the charge control electrode, wherein the first aperture opening is aligned with an optical axis of an objective lens of a scanning charged particle beam unit.

By pre-charging the first portion of the wafer with a flood gun before imaging the first portion with a scanning charged particle beam unit, the pre-charging can be conducted faster as compared to, for example, pre-charging with the scanning charged particle beam unit itself. Accordingly, throughput can be increased. Further, the first portion of the wafer is provided below the charge control electrode while being moved from the pre-charging position to the imaging position. This is beneficial for improved charge control on the wafer to be inspected.

According to some embodiments, which can be combined with other embodiments described herein, the specimen or wafer (or the specimen support table, respectively) can also be biased to a specimen potential, for example a high potential, during imaging of the first portion of the wafer. Yet further, the specimen or wafer can be biased to the same specimen potential during pre-charging of the first portion of the wafer. Accordingly, the potential difference, i.e. the voltage, between the wafer and the charge control electrode is not varied when moving from the pre-charging position to the imaging position.

According to yet further embodiments, which can be combined with other embodiments described herein, the specimen support table can be moved to a position such that the calibration target, which can be provided on the specimen support table, is moved to a position below the flood gun. The charged particles, for example the electrons, emitted by the flood gun may then impinge on the calibration target. Impingement of electrons of the flood gun on the calibration target allows for measuring the current of the flood gun and/or characterizing the electron beam emitted from the flood gun. According to some embodiments described herein, the measurement of the current and/or the characterization of the electron beam of the flood gun can be conducted while the calibration target is biased to the potential, for example a high potential, such as the potential provided to the wafer or specimen support table during pre-charging and/or imaging of the wafer. For the measurement of the current and/or the characterization of the electron beam of the flood gun, the current in the power supply for biasing the wafer or the specimen support table can be measured upon impingement of electrons from the flood gun.

According to alternative embodiments, either the total current emitted from the flood gun can be measured with the calibration target or the profile of the emission current can be measured for characterizing of the electron beam emitted from the flood gun. For measurement of the total current, the calibration target can include the large aperture opening in an aperture plate, which is larger than the beam diameter of the electron beam emitted from the flood gun. The entire beam of the flood gun can enter the calibration target for measurement of the current. For measurement of an admission profile of the electron beam emitted from the flood gun, the calibration target can include a small aperture opening in the aperture plate, which is smaller than the beam diameter of the electron beam emitted from the flood gun. For example, the small diameter can be 2 mm or below, for example 1 mm or below, such as about 0.5 mm. In light of the aperture being smaller than the beam diameter, only a portion of the electron beam emitted from the flood gun passes through the aperture opening. By scanning the small aperture opening relative to the electron beam emitted from the flood gun, by scanning the electron beam emitted from the flood gun relative to the small aperture opening, or by scanning both the electron beam emitted from the flood gun and the small aperture opening of the calibration target, the current profile of the electron beam emitted from the flood gun can be measured.

According to yet further embodiments, which can be combined with other embodiments described herein, the flood gun may also be provided for dis-charging of the portion of the wafer. For example, after positioning the first portion of the wafer below the first aperture opening in the charge control electrode and imaging the first portion of the wafer or at least area of the first portion of the wafer, charge may build up on the area of the wafer upon imaging of the area of the wafer. For dis-charging the area of the first portion of the wafer, the specimen support table may be moved back for positioning the first portion of the wafer below the flood gun aperture opening. The area of the first portion of the wafer can be dis-charged with the flood gun. The specimen support table can be moved back to the imaging position. In the imaging position, the imaging of the first portion of the wafer can be continued.

Embodiments described herein refer to an imaging charged particle beam unit, wherein the focused charged particle beam is scanned over the specimen, in combination with the flood gun, wherein the flood gun and the imaging charged particle beam unit, for example electron beam column, share the charge control electrode such as a proxi electrode. Further, the flood gun and the imaging charged particle beam unit can share a power supply for biasing the charge control electrode. According to yet further additional or alternative implementations, the flood gun and the imaging charged particle beam unit can share an objective lens housing, such that a common magnetic environment is provided for the flood gun and the imaging charged particle beam unit. Based upon the sharing of the charge control electrode and/or the objective lens housing, a beneficial distance between the flood gun and the imaging charged particle beam unit, for example a scanning electron microscope, can be provided. This beneficial distance allows for sufficient separation between the flood gun and the imaging charged particle beam unit. Yet, the flood gun and the imaging charged particle beam unit are close enough to allow for increased throughput, for example based upon reduced movement time of the specimen support table. Beyond that, according to some embodiments, the distance may further allow for pre-charging or dis-charging of one portion of a wafer while another portion of the wafer is imaged with the imaging charged particle beam unit. Accordingly, throughput can be further improved.

According to yet further details of some embodiments, which can be combined with other embodiments described herein, the flood gun charged particle source can be heated to different temperatures during operation of the charged particle beam wafer inspection system. For example, the flood gun charged particle source, such as the flood gun electron source, can be heated to an operation temperature for emitting charged particles, such as electrons. While the flood gun is not used for emitting charged particles, such as electrons, the flood gun charged particle source can be heated to a second temperature lower than the operation temperature. The second temperature can be a temperature sufficiently low enough such that no electrons are emitted from the charged particle source of the flood gun. Lowering the temperature during and idle time of the flood gun enables increasing the lifetime of the flood gun charged particle source.

While the foregoing is directed to embodiments of the invention, other and further embodiments of the invention may be devised without departing from the basic scope thereof, and the scope thereof is determined by the claims that follow.

The invention claimed is:

1. A method of operating a charged particle beam specimen imaging system, comprising:
   biasing a charge control electrode to a first potential;
   moving a specimen support table for positioning a first portion of a specimen below a flood gun aperture opening in the charge control electrode;
   pre-charging the first portion of the specimen with charged particles emitted from a flood gun; and
   moving the specimen support table for positioning the first portion of the specimen below a first aperture opening in the charge control electrode, wherein the first aperture opening is aligned with an optical axis of an objective lens of a scanning charged particle beam unit, wherein a path of a charge particle beam extends through the objective lens and the first aperture opening, and a path of the charged particles emitted from the flood gun extends through the flood gun aperture opening without passing through the objective lens.

2. The method according to claim 1, further comprising:
   scanning the charged particle beam focused by the objective lens over an area of the first portion of the specimen.

3. The method according to claim 2, wherein scanning the charged particle beam is conducted while the charge control electrode is biased to the first potential.

4. The method according to claim 2, further comprising:
   biasing the charge control electrode to a second potential different from the first potential before scanning the charged particle beam.

5. The method according to claim 1, further comprising:
   biasing the specimen to an operation voltage applied while scanning the charged particle beam;
   moving the specimen support table for positioning a calibration target below the flood gun aperture opening in the charge control electrode; and
   measuring a current of charged particles emitted from the flood gun while the calibration target is biased to the operation voltage.

6. The method according to claim 5, further comprising:
   moving the specimen support table while measuring the current of the flood gun for characterizing a profile of the charged particles emitted from the flood gun.

7. The method according to claim 2, further comprising:
pre-charging or dis-charging a second portion of the specimen while scanning the charged particle beam focused by the objective lens over the area of the first portion of the specimen.

\* \* \* \* \*